US012272579B2

(12) United States Patent
Okajima

(10) Patent No.: US 12,272,579 B2
(45) Date of Patent: Apr. 8, 2025

(54) SUBSTRATE PROCESSING APPARATUS, SUBSTRATE SUPPPORT AND METHOD OF MANUFACTURING SEMICONDUCTOR DEVICE

(71) Applicant: Kokusai Electric Corporation, Tokyo (JP)

(72) Inventor: Yusaku Okajima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 399 days.

(21) Appl. No.: 17/591,317

(22) Filed: Feb. 2, 2022

(65) Prior Publication Data

US 2022/0157628 A1 May 19, 2022

Related U.S. Application Data

(63) Continuation of application No. PCT/JP2019/030919, filed on Aug. 6, 2019.

(51) Int. Cl.
*H01L 21/02* (2006.01)
*C23C 16/40* (2006.01)
(Continued)

(52) U.S. Cl.
CPC ...... *H01L 21/67309* (2013.01); *C23C 16/401* (2013.01); *C23C 16/45544* (2013.01);
(Continued)

(58) Field of Classification Search
CPC ............. H01L 21/67309; H01L 21/673; H01L 21/02164; H01L 21/02; H01L 21/0228; H01L 21/02126; H01L 21/02211; H01L 21/67757; H01L 21/677; H01L 21/31; H01L 21/67017; H01L 21/67; H01L 21/67103; H01L 21/67115; H01L 21/67306; H01L 21/56; H01L 21/67126;
(Continued)

(56) References Cited

U.S. PATENT DOCUMENTS

| 2005/0282101 A1 | 12/2005 | Adachi |
| 2008/0216742 A1 | 9/2008 | Takebayashi |
| 2019/0071777 A1 | 3/2019 | Yoshida et al. |

FOREIGN PATENT DOCUMENTS

| JP | 10-189565 A | 7/1998 |
| JP | 11-102903 A | 4/1999 |

(Continued)

OTHER PUBLICATIONS

Taiwan Office Action, Application No. 109122865, Jul. 29, 2021, 14 pgs. (EN/JP).

(Continued)

*Primary Examiner* — Nikolay K Yushin
(74) *Attorney, Agent, or Firm* — Volpe Koenig

(57) ABSTRACT

A substrate processing apparatus includes a process chamber in which one or more substrates are processed; and a substrate support configured to support the one or more substrates in the process chamber. The substrate support includes one or more plate-shaped structures arranged in the substrate support in a manner corresponding to the one or more substrates, and a thickness of a central portion of a plate-shaped structure among the one or more plate-shaped structures is different from a thickness of an outer peripheral portion of the plate-shaped structure located outer of the central portion.

17 Claims, 5 Drawing Sheets

(51) Int. Cl.
  *C23C 16/455*   (2006.01)
  *C23C 16/458*   (2006.01)
  *H01L 21/673*   (2006.01)

(52) U.S. Cl.
  CPC .... *C23C 16/4587* (2013.01); *H01L 21/02164* (2013.01); *H01L 21/0228* (2013.01)

(58) Field of Classification Search
  CPC ... H01L 21/6715; C23C 16/401; C23C 16/40; C23C 16/45544; C23C 16/455; C23C 16/4587; C23C 16/458; C23C 16/45546; C23C 16/4583; C23C 16/46; C23C 16/45576; C23C 16/4581; C23C 16/45; C23C 16/48; C23C 16/50
  See application file for complete search history.

(56)        References Cited

FOREIGN PATENT DOCUMENTS

| JP | 2004-281669 A | 10/2004 |
| JP | 2006-005274 A | 1/2006 |
| JP | 2008-258595 A | 10/2008 |
| JP | 2019-047027 A | 3/2019 |

OTHER PUBLICATIONS

Japanese Office Action issued on Nov. 4, 2022 for Japanese Patent Application No. 2021-538591.
State Intellectual Property Office Action issued on Oct. 25, 2024 for China Patent Application No. 201980099061.9.

SUBSTRATE PROCESSING APPARATUS, SUBSTRATE SUPPPORT AND METHOD OF MANUFACTURING SEMICONDUCTOR DEVICE

CROSS-REFERENCE TO RELATED PATENT APPLICATION

This application is a bypass continuation application of PCT International Application No. PCT/JP2019/030919, filed on Aug. 6, 2019, in the WIPO, the entire contents of which are hereby incorporated by reference.

BACKGROUND

1. Field

The present disclosure relates to a substrate processing apparatus, a substrate support and a method of manufacturing a semiconductor device.

2. Related Art

As a substrate processing apparatus used in a manufacturing process of a semiconductor device, for example, there is a so-called vertical type substrate processing apparatus (hereinafter, also simply referred to as a "vertical type apparatus") in which a load lock chamber (which is a lower chamber) is installed below a process tube (which is a reaction tube). According to some related arts, such substrate processing apparatus is configured to elevate or lower a boat (which is a substrate support or a substrate retainer) capable of supporting a substrate between the process tube and the load lock chamber, and is also configured to perform a predetermined process on the substrate while the boat is accommodated in the process tube.

SUMMARY

According to the present disclosure, there is provided a technique capable of improving a uniformity of a temperature distribution on a surface of the substrate in a substrate processing.

According to one or more embodiments of the present disclosure, there is provided a technique related to a substrate processing apparatus that includes: a process chamber in which one or more substrates are processed; and a substrate support configured to support the one or more substrates in the process chamber, wherein the substrate support includes one or more plate-shaped structures arranged in the substrate support in a manner corresponding to the one or more substrates, and wherein a thickness of a central portion of a plate-shaped structure among the one or more plate-shaped structures is different from a thickness of an outer peripheral portion of the plate-shaped structure located outer of the central portion.

DETAILED DESCRIPTION

Embodiments

Hereinafter, one or more embodiments (also simply referred to as "embodiments") according to the technique of the present disclosure will be described with reference to FIGS. 1 through 5.

(1) Configuration of Substrate Processing Apparatus

A substrate processing apparatus according to the present embodiments is used in a manufacturing process of a semiconductor device, and is configured as a vertical type substrate processing apparatus capable of collectively processing a plurality of substrates (for example, 5 substrates) including a substrate to be processed. For example, the substrate to be processed may include a semiconductor wafer substrate (hereinafter, simply referred to as a "wafer") on which a semiconductor integrated circuit device (that is, the semiconductor device) is manufactured.

Figure 1:
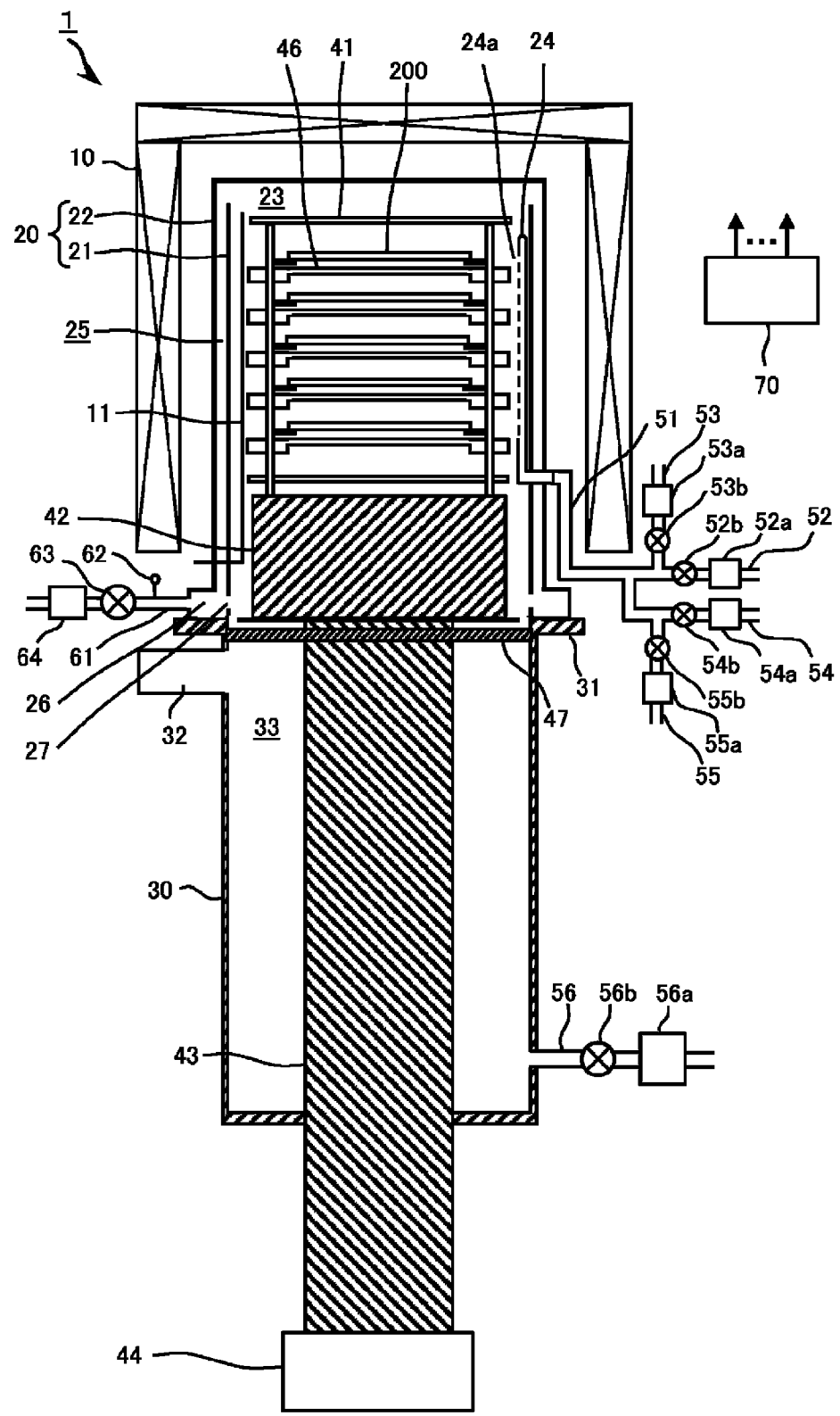
FIG. 1 is a diagram schematically illustrating a vertical cross-section of a process furnace of a substrate processing apparatus preferably used in one or more embodiments of the present disclosure.

As shown in FIG. 1, the substrate processing apparatus according to the present embodiments includes a vertical type process furnace 1. The vertical type process furnace 1 includes a heater 10 serving as a heating apparatus (which is a heating structure or a heating system). The heater 10 is of a cylindrical shape, and is installed perpendicular to an installation floor of the substrate processing apparatus while being supported by a heater base (not shown) serving as a support plate. The heater 10 also functions as an activator (also referred to as an "exciter") capable of activating (exciting) gases by heat.

A reaction tube 20 constituting a reaction vessel (which is a process vessel) is provided in an inner side of the heater 10 to be aligned in a manner concentric with the heater 10. For example, the reaction tube 20 is embodied by a double tube configuration including an inner tube (inner cylinder) 21 and an outer tube (outer cylinder) 22 provided to surround the inner tube 21 and to be aligned in a manner concentric with the inner tube 21. For example, each of the inner tube 21 and the outer tube 22 is made of a heat resistant material such as quartz ($SiO_2$) and silicon carbide (SiC). The inner tube 21 is of a cylindrical shape with open upper and lower ends. The outer tube 22 is of a cylindrical shape with a closed upper end and an open lower end. An upper end portion of the inner tube 21 extends to the vicinity of a ceiling portion of the outer tube 22.

A process chamber 23 in which a plurality of wafers including a wafer 200 serving as a substrate are processed is provided in a hollow cylindrical portion of the inner tube 21.

Hereinafter, the plurality of wafers including the wafer 200 may also be simply referred to as wafers 200. The process chamber 23 is configured such that the wafers 200 can be accommodated in the process chamber 23 while being arranged in the process chamber 23 from an end (that is, a lower end) toward the other end (that is, an upper end) of the process chamber 23. A region in the process chamber 23 in which the wafers 200 are arranged may also be referred to as a "substrate arrangement region" or a "wafer arrangement region". In addition, a direction in which the wafers 200 are arranged in the process chamber 23 may also be referred to as a "substrate arrangement direction" or a "wafer arrangement direction".

A lower chamber 30 (in which a load lock chamber is provided) is provided below the outer tube 22 (that is, the reaction tube 20). For example, the lower chamber 30 is made of a metal material such as stainless steel (SUS), and an inner diameter of the lower chamber 30 is substantially the same as an inner diameter of the inner tube 21. The lower chamber 30 is of a cylindrical shape with an open upper end and a closed lower end (that is, a cylindrical shape with a bottom and without a ceiling). The lower chamber 30 is arranged so as to communicate with the inner tube 21. A flange 31 is provided at an upper end portion of the lower chamber 30. For example, the flange 31 is made of a metal material such as the SUS. An upper end portion of the flange 31 is engaged with each lower end portion of the inner tube 21 and the outer tube 22 such that the flange 31 can support the inner tube 21 and the outer tube 22 (that is, the reaction tube 20). Similar to the heater 10, the inner tube 21 and the outer tube 22 are installed perpendicular to the installation floor of the substrate processing apparatus. A transfer chamber (which is the load lock chamber) 33 serving as a transfer space through which the wafer 200 is transferred is constituted by a hollow cylindrical portion (which is a closed space) of the lower chamber 30.

A nozzle 24 serving as a part of a gas supplier (which is a gas supply structure) is provided in the process chamber 23 so as to penetrate the inner tube 21 and the outer tube 22. For example, the nozzle 24 is made of a heat resistant material such as quartz and SiC, and may include an L-shaped long nozzle. A gas supply pipe 51 is connected to the nozzle 24. For example, two gas supply pipes 52 and 54 are connected to the gas supply pipe 51 such that various gases (for example, two gases) can be supplied into the process chamber 23 via the nozzle 24 and the gas supply pipes 51, 52 and 54. For example, each of the gas supply pipes 51, 52 and 54 and gas supply pipes 53, 55 and 56 described later is made of a metal material such as the SUS.

A mass flow controller (MFC) 52a serving as a flow rate controller (flow rate controlling structure) and a valve 52b serving as an opening/closing valve are sequentially provided in this order from an upstream side to a downstream side of the gas supply pipe 52 along a gas flow direction. The gas supply pipe 53 is connected to the gas supply pipe 52 at a downstream side of the valve 52b. An MFC 53a and a valve 53b are sequentially provided in this order from an upstream side to a downstream side of the gas supply pipe 53 along the gas flow direction.

An MFC 54a and a valve 54b are sequentially provided in this order from an upstream side to a downstream side of the gas supply pipe 54 along the gas flow direction. The gas supply pipe 55 is connected to the gas supply pipe 54 at a downstream side of the valve 54b. An MFC 55a and a valve 55b are sequentially provided in this order from an upstream side to a downstream side of the gas supply pipe 55 along the gas flow direction.

The gas supply pipe 56 is connected at a lower region of a side wall of the lower chamber 30. An MFC 56a and a valve 56b are sequentially provided in this order from an upstream side to a downstream side of the gas supply pipe 56 along the gas flow direction.

The nozzle 24 is connected to a front end portion (tip) of the gas supply pipe 51. The nozzle 24 is installed in an annular space provided between an inner wall of the inner tube 21 and the wafers 200, and extends upward from a lower region toward an upper region of the process chamber 23 along the inner wall of the inner tube 21 (that is, extends upward along the wafer arrangement direction of the wafers 200). That is, the nozzle 24 is installed at a side portion of the wafer arrangement region, that is, in a region that horizontally surrounds the wafer arrangement region along the wafer arrangement direction. A plurality of gas supply holes 24a through which a gas such as a source gas and a reactive gas described later is supplied are provided at a side surface of the nozzle 24. The plurality of gas supply holes 24a are open toward a center of the reaction tube 20 such that the gas can be supplied to each of the wafers 200 through the plurality of gas supply holes 24a. The plurality of gas supply holes 24a are provided at positions facing the wafers 200 supported by a boat 41 described later from a lower region toward an upper region of the reaction tube 20 (that is, from a lower region toward an upper region of the nozzle 24).

The gas supply pipe 52 is configured such that the source gas (that is, a source), which is a first process gas (also referred to as a "first film-forming gas" or a "first metal-containing gas"), can be supplied into the process chamber 23 through the gas supply pipe 52 via the MFC 52a, the valve 52b, the gas supply pipe 51 and the nozzle 24. As the source gas, a halosilane-based gas containing silicon (Si) serving as a main element (predetermined element) constituting a film formed on the wafer 200 and a halogen element may be used. For example, the source gas refers to the source in a gaseous state under a normal temperature and a normal pressure or a gas obtained by vaporizing the source in a liquid state under the normal temperature and the normal pressure. The halosilane-based gas refers to a silane-based gas containing a halogen group. The halogen group includes the halogen element such as chlorine (Cl), fluorine (F), bromine (Br) and iodine (I). As the halosilane-based gas, for example, the source gas containing silicon (Si) and chlorine, that is, a chlorosilane-based gas may be used. The chlorosilane-based gas serves as a silicon source. As the chlorosilane-based gas, for example, hexachlorodisilane ($Si_2Cl_6$, abbreviated as HCDS) gas may be used.

The gas supply pipe 54 is configured such that the reactive gas (that is, a reactant), which is a second process gas (also referred to as a "second film-forming gas"), can be supplied into the process chamber 23 through the gas supply pipe 54 via the MFC 54a, the valve 54b, the gas supply pipe 51 and the nozzle 24. As the reactive gas, an oxygen (O)-containing gas may be used. The oxygen-containing gas serves as an oxygen-source (which is an oxidizing gas or an oxidizing agent). As the oxygen-containing gas, for example, oxygen ($O_2$) gas may be used.

The gas supply pipes 53 and 55 are configured such that an inert gas such as nitrogen ($N_2$) gas can be supplied into the process chamber 23 through each of the gas supply pipes 53 and 55 via the MFCs 53a and 55a, the valves 53b and 55b, the gas supply pipes 51, 52 and 54 and the nozzle 24. The $N_2$ gas serves as a purge gas, a dilution gas or a carrier gas.

The gas supply pipe 56 is configured such that the inert gas such as the nitrogen ($N_2$) gas can be supplied into the lower chamber 30 through the gas supply pipe 56 via the MFC 56a and the valve 56b. The $N_2$ gas serves as the purge gas.

A first process gas supplier (which is a first process gas supply system) is constituted mainly by the gas supply pipe 52, the MFC 52a and the valve 52b. The first process gas supplier may further include the gas supply pipe 51 and the nozzle 24. A second process gas supplier (which is a second process gas supply system) is constituted mainly by the gas supply pipe 54, the MFC 54a and the valve 54b. The second process gas supplier may further include the gas supply pipe 51 and the nozzle 24. A first inert gas supplier (which is a first inert gas supply system) is constituted mainly by the gas supply pipes 53 and 55, the MFC 53a and 55a and the valves 53b and 55b. The first inert gas supplier may further include the gas supply pipes 51, 52 and 54 and the nozzle 24. A second inert gas supplier (which is a second inert gas supply system) is constituted mainly by the gas supply pipe 56, the MFC 56a and the valve 56b.

A pumping structure 26 (which is a gas stagnation space serving as an exhaust buffer) is provided at the lower end portion of the outer tube 22 so as to surround the outer tube 22. The pumping structure 26 is arranged below the heater 10 provided to surround the outer tube 22. The pumping structure 26 communicates with an exhaust flow path 25 (which is an annular space between the inner tube 21 and the outer tube 22), and is configured to temporarily allow the gas flowing through the exhaust flow path 25 to stagnate therein.

A plurality of openings 27 through which the gas is discharged from an inside of the inner tube 21 and the transfer chamber 33 to the pumping structure 26 are provided below the inner tube 21. The plurality of openings 27 are provided along a circumferential direction of the inner tube 21 at positions facing the pumping structure 26 and as close as possible to the lower chamber 30.

An exhaust pipe 61 through which the gas stagnant in the pumping structure 26 is exhausted is connected to the pumping structure 26. A vacuum pump 64 serving as a vacuum exhaust apparatus is connected to the exhaust pipe 61 through a pressure sensor 62 serving as a pressure detector (which is a pressure detecting structure) configured to detect an inner pressure of the process chamber 23 and an APC (Automatic Pressure Controller) valve 63 serving as a pressure regulator (which is a pressure adjusting structure). With the vacuum pump 64 in operation, the APC valve 63 may be opened or closed to perform a vacuum exhaust of an inner atmosphere of the process chamber 23 or stop the vacuum exhaust. In addition, with the vacuum pump 64 in operation, an opening degree of the APC valve 63 may be adjusted in order to adjust the inner pressure of the process chamber 23 based on pressure information detected by the pressure sensor 62. An exhauster (which is an exhaust system or an exhaust line) is constituted mainly by the exhaust pipe 61, the APC valve 63 and the pressure sensor 62. The exhauster may further include the exhaust flow path 25, the pumping structure 26 and the vacuum pump 64.

A substrate loading/unloading port 32 is provided at an upper region of the side wall of the lower chamber 30. The wafer 200 is transferred into or out of the transfer chamber 33 by a transfer robot (not shown) through the substrate loading/unloading port 32. In the transfer chamber 33, the wafer 200 may be transferred (loaded) into the boat 41 described later, and the wafer 200 may be transferred (unloaded) out of the boat 41.

The boat 41 serving as a substrate retainer is configured such that the wafers 200 (for example, 5 wafers) are accommodated (or supported) in a vertical direction in the boat 41 while the wafers 200 are horizontally oriented with their centers aligned with one another with a predetermined gap therebetween in a multistage manner. For example, the boat 41 is made of a heat resistant material such as quartz and SiC. A heat insulator 42 is provided below the boat 41. As the heat insulator 42, for example, a plurality of heat insulation plates made of a heat resistant material such as quartz and SiC and horizontally oriented in a multistage manner may be used. Instead of the plurality of heat insulation plates, as the heat insulator 42, for example, a heat insulating cylinder made of a heat resistant material such as quartz and SiC may be used.

A plurality of plate-shaped structures (which are separators) (hereinafter, also referred to as "plates") 46 are arranged in the boat 41 in a manner corresponding to the wafers 200 in a multistage manner at positions between adjacent wafers among the wafers 200 and at a position below a lowermost wafer among the wafers 200. Hereinafter, the plurality of plates 46 may also be simply referred to as plates 46, and each of the plates 46 may also be referred to as a plate 46.

Each of the plates 46 is arranged on the boat 41 such that the wafer 200 does not contact other wafers among the wafers 200 when the wafer 200 is loaded into the boat 41. In addition, when the plates 46 are arranged on the boat 41 and the wafers 200 are loaded on the boat 41, a front surface of the plate 46 faces a back surface of the wafer 200 located immediately above the plate 46 and is disposed parallel to the back surface of the wafer 200 located immediately above the plate 46. In the present specification, the term "front surface of the wafer 200" refers to a surface to be processed of the wafer 200, and the term "back surface of the wafer 200" refers to a surface of the wafer 200 opposite to the surface to be processed. In addition, in the present specification, the term "front surface of the plate 46" refers to a surface of the plate 46 facing the back surface of the wafer 200 located immediately above the plate 46, and the term "back surface of the plate 46" refers to a surface of the plate 46 opposite to the front surface of the plate 46.

By providing a space between the back surface of the wafer 200 located immediately above the plate 46 and the front surface of the plate 46 without bringing the plate 46 into contact with the wafer 200 (that is, without placing the wafer 200 on the plate 46), the wafer 200 is mainly heated by the heat radiation from the heater 10 and the secondary heat radiation from the plate 46. That is, the heat conduction from the plate 46 is not used for heating the wafer 200. Thereby, it is possible to easily uniformize temperatures of the wafers 200 in a film-forming process described later. That is, it is possible to improve a uniformity of a temperature distribution among the wafers 200 (that is, the temperatures of the wafers 200) in the film-forming process.

Further, by arranging the front surface of the plate 46 parallel to the back surface of the wafer 200 located immediately above the plate 46, it is possible to uniformize the heat capacity of the space between the back surface of the wafer 200 located immediately above the plate 46 and the front surface of the plate 46. As a result, it is possible to uniformly heat the wafer 200 on the surface of the wafer 200, and it is also possible to improve a uniformity of a temperature distribution of the wafer 200 (that is, the temperature of the wafer 200) on the surface of the wafer 200 in the film-forming process described later.

The plate 46 is arranged in the boat 41 such that a space (or a volume of the space) facing the front surface of the wafer among the wafers 200 located immediately below the plate 46 is greater than a space (or a volume of the space) facing the back surface of the wafer 200 located immediately above the plate 46. That is, the plate 46 is arranged in the boat 41 such that a distance between the front surface of the plate 46 and the back surface of the wafer 200 located immediately above the plate 46 is shorter than a distance between the back surface of the plate 46 and the front surface of the wafer 200 located immediately below the plate 46. In addition, in the present specification, the term "space facing the front surface of the wafer 200" refers to a space on the front surface of the wafer 200, that is, a space formed on a surface side of the wafer 200 through which the gas flows. In the present specification, the term "space facing the back surface of the wafer 200" refers to a space on the back surface of the wafer 200 located immediately above the plate 46 (a space between the back surface of the wafer 200 located immediately above the plate 46 and the front surface of the plate 46), that is, a space formed on the back surface of the wafer 200 through which the gas flows. As a result, an amount of the gas flowing in the space on the front surface of the wafer 200 is set to be greater than an amount of the gas flowing in the space on the back surface of the wafer 200 such that it is possible to prevent (or suppress) a film-forming rate in the film-forming process described later from being decreased. In addition, by increasing the amount of the gas flowing in the space on the front surface of the wafer 200, it is possible to prevent (or suppress) the gas from being stagnated on the front surface of the wafer 200. Thereby, it is possible to improve a uniformity of the processing of the wafer 200 on the surface of the wafer 200.

Figure 3A:
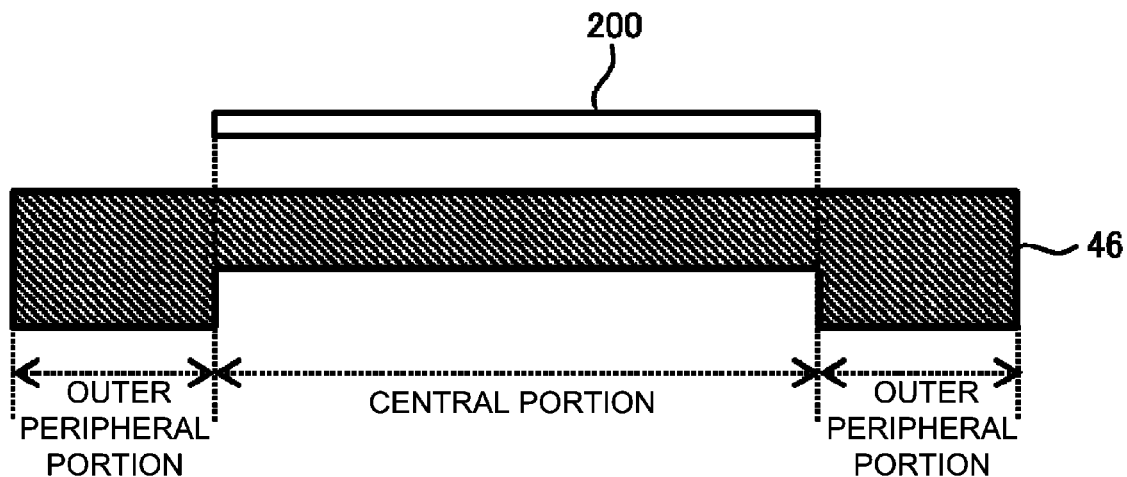
FIG. 3A is an enlarged view schematically illustrating an example of a main configuration of the substrate processing apparatus preferably used in the embodiments of the present disclosure.

For example, the plate 46 is of a circular shape when viewed from above, and a diameter of the plate 46 is set to be greater than a diameter of the wafer 200. The plate 46 is configured such that the heat capacity of the plate 46 is different in a radial direction depending on a distance from the heater 10 to the plate 46 in the process chamber 23. That is, as shown in FIG. 3A, a thickness of a central portion of the plate 46 is different from that of an outer peripheral portion of the plate 46 located outer of the central portion. Thereby, it is possible to improve the uniformity of the temperature of the wafer 200 on the surface of the wafer 200 in the film-forming process described later.

In the present specification, the term "central portion of the plate 46 (also simply referred to as the "central portion") refers to a portion of the plate 46 facing the wafer 200 and located radially inner of the plate 46, and the term "outer peripheral portion of the plate 46 (also simply referred to as the "outer peripheral portion") refers to a portion of the plate 46 not facing the wafer 200 and located radially outer of the plate 46.

The thickness of the outer peripheral portion of the plate 46 is set to be greater than the thickness of the central portion of the plate 46. That is, the heat capacity of the outer peripheral portion of the plate 46 is set to be greater than the heat capacity of the central portion of the plate 46.

A distance from the heater 10 to an outer peripheral portion of the wafer 200 in the process chamber 23 is shorter than a distance from the heater 10 to a central portion of the wafer 200 in the process chamber 23. Therefore, when the wafer 200 is heated in the film-forming process, the outer peripheral portion of the wafer 200 absorbs more radiant heat from the heater 10 than the central portion of the wafer 200, and thereby is easily heated. When the wafer 200 is being heated, since the heat capacity of the outer peripheral portion of the plate 46 is greater than the heat capacity of the central portion of the plate 46, the outer peripheral portion of the plate 46 is less likely to be heated than the central portion of the plate 46. Thereby, when the wafer 200 is being heated in the film-forming process, it is possible to decrease the heat radiation from the plate 46 in the outer peripheral portion of the wafer 200, and it is also possible to increase the heat radiation from the plate 46 in the central portion of the wafer 200. As a result, it is possible to improve the uniformity of the temperature of the wafer 200 on the surface of the wafer 200 when the wafer 200 is being heated in the film-forming process described later.

In addition, when the wafer 200 is being cooled in the film-forming process, the outer peripheral portion of the wafer 200 is more likely to be cooled than the central portion of the wafer 200. When the wafer 200 is being cooled, since the heat capacity of the outer peripheral portion of the plate 46 is greater than the heat capacity of the central portion of the plate 46, the outer peripheral portion of the plate 46 is less likely to be cooled than the central portion of the plate 46. Thereby, when the wafer 200 is being cooled in the film-forming process, it is possible to increase the heat radiation from the plate 46 in the outer peripheral portion of the wafer 200, and it is also possible to decrease the heat radiation from the plate 46 in the central portion of the wafer 200. As a result, it is possible to improve the uniformity of the temperature of the wafer 200 on the surface of the wafer 200 when the wafer 200 is being cooled in the film-forming process.

In addition, in the present specification, the term "the uniformity of the temperature of the wafer 200 on the surface of the wafer 200 in the film-forming process" may refer to "the uniformity of the temperature of the wafer 200 on the surface of the wafer 200 when the wafer 200 is being heated", may refer to "the uniformity of the temperature of the wafer 200 on the surface of the wafer 200 when the wafer 200 is being cooled", or may refer to both of them.

It is preferable that the thickness of the outer peripheral portion of the plate 46 is set to be greater than the thickness of the central portion of the plate 46 over an entire circumference in the circumferential direction of the plate 46. Thereby, it is possible to reliably improve the uniformity of the temperature of the wafer 200 on the surface of the wafer 200 in the film-forming process.

The thickness of the central portion of the plate 46 may be set to a predetermined thickness in the range of, for example, 2 mm to 7 mm, and the thickness of the outer peripheral portion of the plate 46 may be set to a predetermined thickness in the range of, for example, 5 mm to 15 mm. By setting the thickness of the central portion of the plate 46 within the range exemplified above, it is possible to decrease the heat capacity of the central portion, and it is also possible to prevent (or suppress) the plate 46 from being deformed into a wavy shape (where wavy irregularities may be formed on the plate 46) when the wafer 200 is being heated in the film-forming process described later. Thereby, it is possible to improve the uniformity of the temperature of the wafer 200 on the surface of the wafer 200 in the film-forming process. By setting the thickness of the outer peripheral portion of the plate 46 within the range exemplified above, a ratio of the heat radiation from the outer peripheral portion to the heat radiation from the central portion of the plate 46 can be set within an appropriate range. Thereby, it is possible to improve the uniformity of the temperature of the wafer 200 on the surface of the wafer 200 in the film-forming process.

A back surface of the outer peripheral portion of the plate 46 protrudes further than a back surface of the central portion of the plate 46. That is, the outer peripheral portion of the plate 46 protrudes downward in the wafer arrangement direction (downward in a thickness direction of the plate 46) to form a convex portion. By forming the convex portion on the back surface of the outer peripheral portion of the plate 46 as described above and by the front surface of the plate 46 being configured as a flat surface, it is possible to prevent (or suppress) a gas flow of the gas from being obstructed on the back surface of the wafer 200 even when the space on the back surface of the wafer 200 is decreased. For example, by preventing a flow of the purge gas from being obstructed in the space on the back surface of the wafer 200 in the film-forming process described later, it is possible to prevent (or suppress) a substance such as reaction products and by-products from being deposited on the front surface of the plate 46. As a result, it is possible to prevent (or suppress) a change in the heat capacity in the radial direction of the plate 46 during the film-forming process described later, and it is also possible to prevent (or suppress) the uniformity of the temperature of the wafer 200 on the surface of the wafer 200 from decreasing in the film-forming process described later. In addition, since the front surface of the plate 46 is configured as the flat surface, it is possible to prevent the plate 46 from obstructing an operation of an arm of the transfer robot when the transfer robot loads or unloads the wafer 200 onto or out of the boat 41. For example, it is possible to prevent the arm of the transfer robot from making contact with (or being caught by) the convex portion of the plate 46. In addition, since the front surface of the plate 46 is configured as the flat surface, it is possible to increase the shortest distance (clearance) between adjacent plates 46 as compared with a case where a convex portion is provided on a front surface of the outer peripheral portion of the plate 46 and the back surface of the plate 46 is configured as a flat surface. Thereby, for example, when the arm of the transfer robot is deformed (bent) by supporting the wafer 200, it is possible to prevent the arm from making contact with the plate 46 when the wafer 200 is loaded or unloaded.

It is preferable that the convex portion is provided continuously over the entire circumference of the outer peripheral portion of the plate 46. Thereby, it is possible to reliably improve the uniformity of the temperature of the wafer 200 on the surface of the wafer 200 in the film-forming process. In addition, it is possible to reliably prevent (or suppress) the gas flow of the gas from being obstructed on the back surface of the wafer 200.

For example, the plate 46 is made of a highly thermal conductive material (that is, a material whose thermal conductivity is high) and a heat resistant material such as quartz and SiC. Thereby, it is possible to increase a heating efficiency of the plate 46. The central portion and the outer peripheral portion of the plate 46 may be made of different materials. For example, the central portion of the plate 46 may be made of a material more easily absorbing the heat (heat radiation) from the heater 10 as compared with a material constituting the outer peripheral portion of the plate 46. Specifically, for example, the central portion of the plate 46 may be made of SiC, and the outer peripheral portion of the plate 46 may be made of quartz. Thereby, it is possible to improve the uniformity of the temperature of the wafer 200 on the surface of the wafer 200 in the film-forming process described later.

For example, the front surface of the plate 46 may be subject to a surface treatment such that a surface area of the front surface of the plate 46 becomes similar to (or equal to) a surface area of the back surface of the wafer 200 located immediately above the plate 46. That is, a surface state of the front surface of the plate 46 may be set such that the surface area of the front surface of the plate 46 is similar to the surface area of the back surface of the wafer 200. As an example of the surface treatment described above, a coating process of providing a layer for increasing the surface area of the front surface of the plate 46 may be performed on the front surface of the plate 46 such that the surface area of the front surface of the plate 46 is similar to the surface area of the back surface of the wafer 200. For example, the layer may be formed on the front surface of the plate 46 by a method such as a silicon thermal spraying method. Further, as another example of the surface treatment described above, a roughening process such as a sandblasting process may be performed. By making the surface area of the front surface of the plate 46 similar to the surface area of the back surface of the wafer 200, for example, a consumption amount (or an adsorption amount) of the first process gas can be made approximately equal to that of the second process gas or the like on the back surface of the wafer 200 and on the front surface of the plate 46. As a result, it is possible to prevent (or suppress) the plate 46 from adversely affecting the film-forming process described later.

Figure 2:
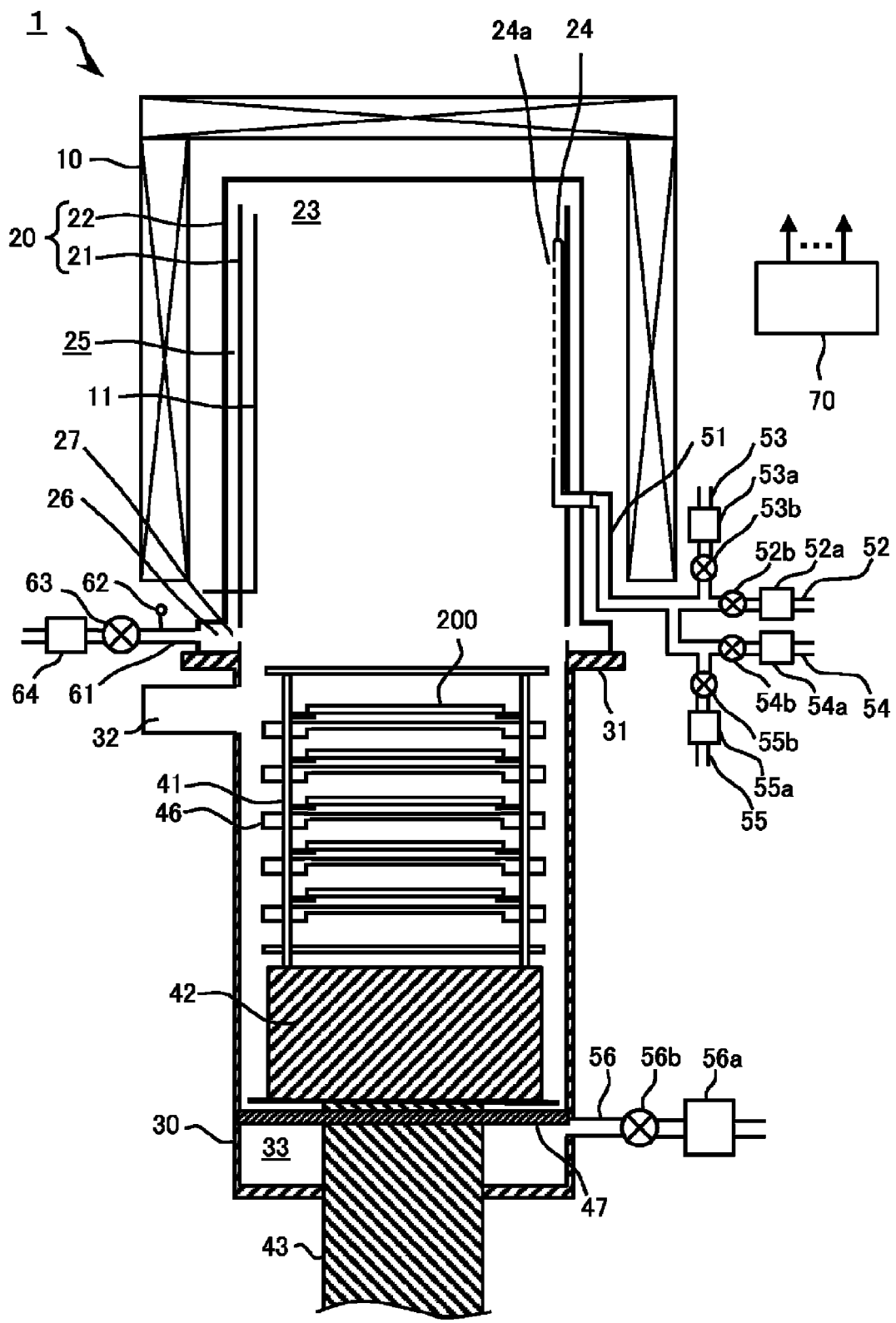
FIG. 2 is a diagram schematically illustrating the vertical cross-section of the process furnace of the substrate processing apparatus preferably used in the embodiments of the present disclosure.

The boat 41 is supported by a rod 43. The rod 43 penetrates the bottom of the lower chamber 30 while maintaining an airtightness of the transfer chamber 33, and is connected to an elevator/rotator (which is an elevating and rotating structure such as a boat elevator) 44 provided outside and below the lower chamber 30. The elevator/rotator 44 is configured to elevate or lower the wafers 200 supported by the boat 41 in the vertical direction between the process chamber 23 and the transfer chamber 33 by elevating or lowering the boat 41. That is, the elevator/rotator 44 serves as a transfer device (which is a transfer structure) configured to transfer the boat 41 (that is, the wafers 200) between the process chamber 23 and the transfer chamber 33. For example, when the elevator/rotator 44 performs an elevating operation, the boat 41 is elevated to a position (also referred to as a "wafer processing position") in the process chamber 23 as shown in FIG. 1, and when the elevator/rotator 44 performs a lowering operation, the boat 41 is lowered to a position (also referred to as a "wafer transfer position") in the transfer chamber 33 as shown in FIG. 2. In addition, the elevator/rotator 44 is configured to rotate the wafers 200 by rotating the boat 41.

A lid 47 configured to close a lower portion of the reaction tube 20 may be provided in the vicinity of an upper end of the rod 43 and below the heat insulator 42. By providing the lid 47 and by closing the lower portion of the reaction tube 20, it is possible to prevent (or suppress) the source gas or the reactive gas existing in the reaction tube 20 from diffusing into the transfer chamber 33. In addition, it is possible to easily control an inner pressure of the reaction tube 20, and it is also possible to improve the uniformity of the processing of the wafer 200.

A temperature sensor 11 serving as a temperature detector is installed in the inner tube 21. The state of electric conduction to the heater 10 may be adjusted based on temperature information detected by the temperature sensor 11 such that a desired temperature distribution of an inner temperature of the process chamber 23 can be obtained. Similar to the nozzle 24, the temperature sensor 11 is L-shaped, and is provided along the inner wall of the inner tube 21.

Figure 4:
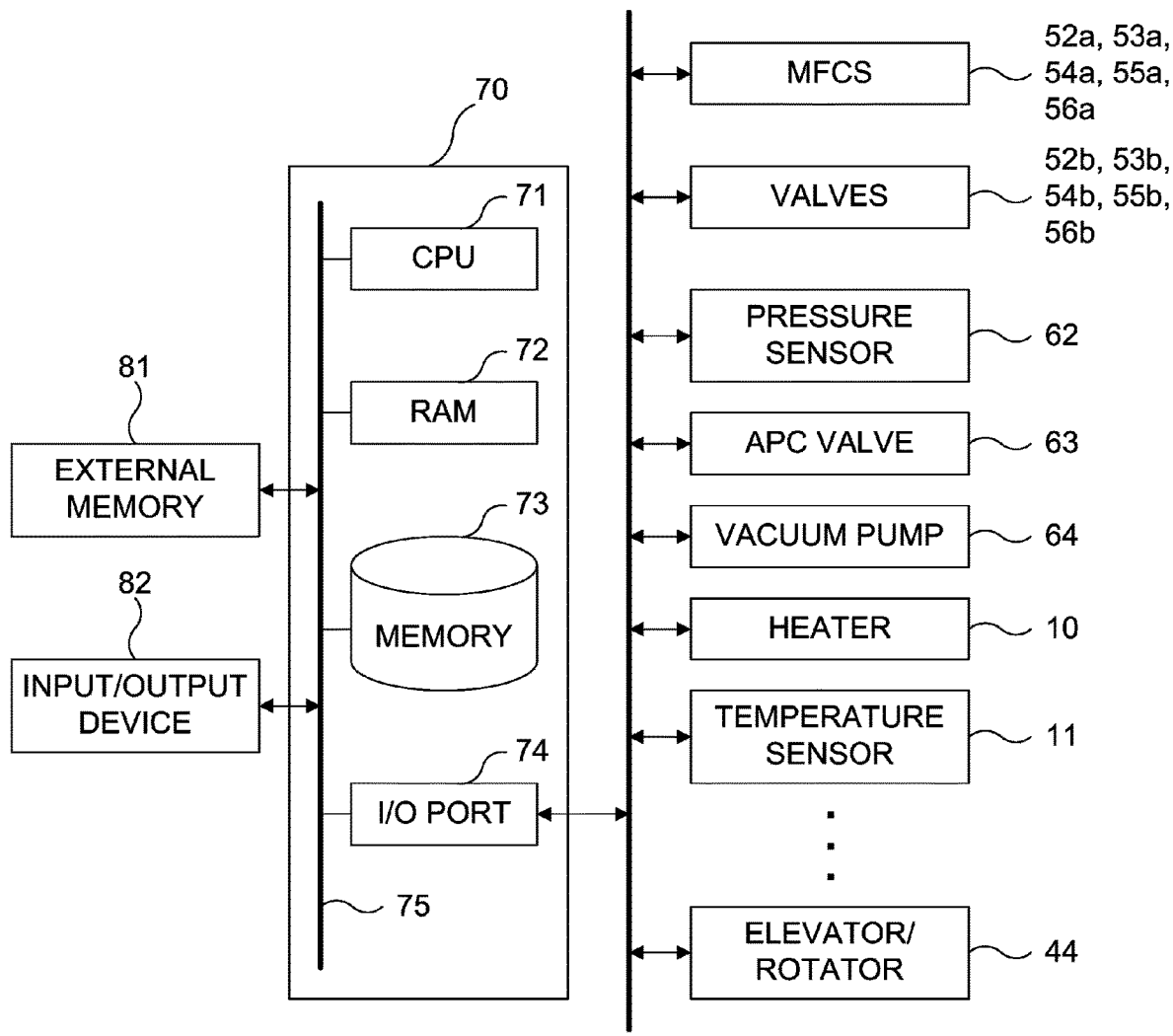
FIG. 4 is a block diagram schematically illustrating a configuration of a controller and related components of the substrate processing apparatus preferably used in the embodiments of the present disclosure.

As shown in FIG. 4, a controller 70 serving as a control device (control structure) is constituted by a computer including a CPU (Central Processing Unit) 71, a RAM (Random Access Memory) 72, a memory 73 and an input/output (I/O) port 74. The RAM 72, the memory 73 and the I/O port 74 may exchange data with the CPU 71 through an internal bus 75. For example, an external memory 81 and an input/output device 82 constituted by a component such as a touch panel is connected to the controller 70.

For example, the memory 73 is configured by a component such as a flash memory and a hard disk drive (HDD). For example, data such as a control program configured to control operations of the substrate processing apparatus and a process recipe containing information on the sequences and conditions of a method of manufacturing a semiconductor device described later may be readably stored in the memory 73. The process recipe is obtained by combining steps (or processes) of the method of manufacturing the semiconductor device described later such that the controller 70 can execute the steps to acquire a predetermined result, and functions as a program. Hereinafter, the process recipe and the control program may be collectively or individually referred to as a "program". In addition, the process recipe may also be simply referred to as a "recipe". In the present specification, the term "program" may refer to the recipe alone, may refer to the control program alone, or may refer to both of the recipe and the control program. The RAM 72 functions as a memory area (work area) where a program or data read by the CPU 71 is temporarily stored.

The I/O port 74 is connected to the above-described components such as the MFCs 52a, 53a, 54a, 55a and 56a, the valves 52b, 53b, 54b, 55b and 56b, the pressure sensor 62, the APC valve 63, the vacuum pump 64, the heater 10, the temperature sensor 11 and the elevator/rotator 44.

The CPU 71 is configured to read the control program from the memory 73 and execute the read control program. In addition, the CPU 71 is configured to read the recipe from the memory 73 in accordance with an operation command inputted from the input/output device 82. According to the contents of the read recipe, the CPU 71 may be configured to be capable of controlling various operations such as flow rate adjusting operations for various gases by the MFCs 52a, 53a, 54a, 55a and 56a, opening and closing operations of the valves 52b, 53b, 54b, 55b and 56b, an opening and closing operation of the APC valve 63, a pressure adjusting operation by the APC valve 63 based on the pressure sensor 62, a start and stop of the vacuum pump 64, a temperature adjusting operation by the heater 10 based on the temperature sensor 11, an operation of adjusting the rotation and the rotation speed of the boat 41 by the elevator/rotator 44 and an elevating and lowering operation of the boat 41 by the elevator/rotator 44.

The controller 70 may be embodied by installing the above-described program stored in the external memory 81 into the computer. For example, the external memory 81 may include a magnetic tape, a magnetic disk such as a hard disk drive (HDD), an optical disk such as a CD, a magneto-optical disk such as an MO and a semiconductor memory such as a USB memory. The memory 73 or the external memory 81 may be embodied by a non-transitory computer readable recording medium. Hereinafter, the memory 73 and the external memory 81 may be collectively or individually referred to as a "recording medium". In the present specification, the term "recording medium" may refer to the memory 73 alone, may refer to the external memory 81 alone, and may refer to both of the memory 73 and the external memory 81. Instead of the external memory 81, a communication means such as the Internet and a dedicated line may be used for providing the program to the computer.

(2) Substrate Processing

Hereinafter, as a part of the manufacturing process of the semiconductor device, an exemplary sequence of a substrate processing (also referred to as a "film-forming sequence") of forming a silicon oxide film (hereinafter, also simply referred to as an "SiO film") serving as a metal film on the wafer 200 serving as the substrate will be described. The substrate processing of forming the film is performed by using the substrate processing apparatus described above. In the following description, the operations of the components constituting the substrate processing apparatus are controlled by the controller 70.

Figure 5:
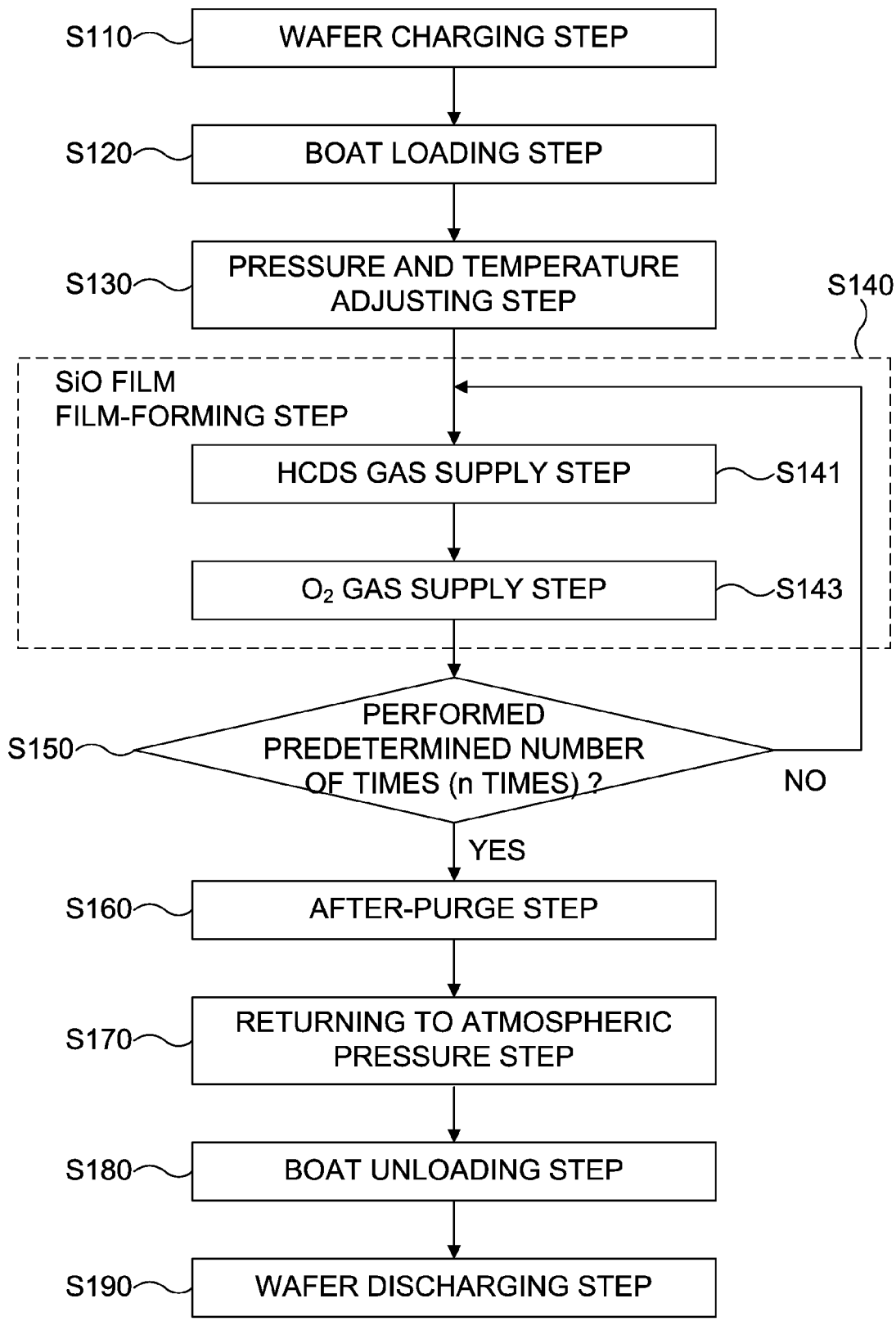
FIG. 5 is a flowchart schematically illustrating a film-forming sequence performed by the substrate processing apparatus preferably used in the embodiments of the present disclosure.

In a film-forming step (film-forming sequence) shown in FIG. 5, a step of forming a film containing silicon (Si) and oxygen (O) (that is, the SiO film) on the wafer 200 by performing a cycle a predetermined number of times, wherein the cycle includes a step of supplying the HCDS gas to the wafer 200 and a step of supplying the $O_2$ gas to the wafer 200, and the steps of the cycle are performed non-simultaneously.

In the present specification, the film-forming sequence shown in FIG. 5 may be represented for simplicity's sake as follows. Film-forming sequences of other embodiments, which will be described later, will be also represented in the same manner.

$$(HCDS \rightarrow O_2) \times n \Rightarrow SiO$$

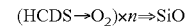

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer or a film formed on a wafer". Thus, in the present specification, "forming a predetermined layer on a wafer" may refer to "forming a predetermined layer on a surface of a wafer itself", or may refer to "forming a predetermined layer on a surface of another layer or another film formed on a wafer". In the present specification, the terms "substrate" and "wafer" may be used as substantially the same meaning. That is, the term "substrate" may be substituted by "wafer" and vice versa.

<Wafer Charging Step S110>

The wafers (for example, 5 wafers) 200 are loaded (charged) into the boat 41 in which the plates 46 are arranged in a multistage manner (wafer charging). Specifically, in the transfer chamber 33, the wafer 200 is placed at a predetermined position (which is a wafer placing position) of the boat 41 through the substrate loading/unloading port 32 while the wafer placing position of the boat 41 faces the substrate loading/unloading port 32. After loading the wafer 200 at the wafer placing position of the boat 41, another wafer among the wafers 200 is loaded at another wafer placing position of the boat 41 while vertically moving the boat 41 by the elevator/rotator 44. The operation described above is performed a plurality of times until the wafers 200 are completely loaded into the boat 41. Specifically, the wafers 200 are loaded into the boat 41 while lowering the boat 41. In addition, the plates 46 are arranged in a multi-stage manner in advance such that the plates 46 are provided at positions between the adjacent wafers among the wafers 200 or below the lowermost wafer among the wafers 200 when the wafers 200 are completely loaded into the boat 41.

In the wafer charging step S110, the wafers 200 loaded in the boat 41 are heated by the plates 46.

<Boat Loading Step S120>

After the wafers 200 are loaded into the boat 41, as shown in FIG. 1, the boat 41 supporting the wafers 200 is elevated (lifted) such that the boat 41 is transferred (or loaded) into the process chamber 23 by the elevator/rotator 44 (boat loading). In the boat loading step S120, the vertical position of the boat 41 is adjusted such that a vertical position of a gas supply hole among the plurality of gas supply holes 24a corresponding to the plate 46 is located between the back surface of the outer peripheral portion of the plate 46 and the front surface of the wafer among the wafers 200 located immediately below the plate 46 or located at a position slightly higher than the front surface of an uppermost wafer among the wafers 200. Thereby, it is possible to reliably supply the gas to the front surface of each of the wafers 200.

<Pressure and Temperature Adjusting Step S130>

The inner atmosphere of the process chamber 23 (that is, a space in which the wafers 200 are accommodated) is vacuum-exhausted (decompression-exhausted) by the vacuum pump 64 until the inner pressure of the process chamber 23 reaches and is maintained at a desired pressure (vacuum degree). When the inner atmosphere of the process chamber 23 is vacuum-exhausted, the inner pressure of the process chamber 23 is measured by the pressure sensor 62, and the APC valve 63 is feedback-controlled based on the pressure information measured by the pressure sensor 62 (pressure adjusting). In addition, the heater 10 heats the process chamber 23 such that the inner temperature of the process chamber 23 reaches and is maintained at a desired temperature for processing the wafer 200. When the process chamber 23 is heated by the heater 10, the state of the electric conduction to the heater 10 is feedback-controlled based on the temperature information detected by the temperature sensor 11 such that the desired temperature distribution of the inner temperature of the process chamber 23 is obtained (temperature adjusting). Further, the elevator/rotator 44 rotates the wafers 200 by rotating the boat 41. The inner atmosphere of the process chamber 23 is continuously vacuum-exhausted by the vacuum pump 64 and the wafers 200 are continuously heated and rotated until at least the processing of the wafer 200 is completed.

<SiO Film Film-Forming Step S140>

Thereafter, as the SiO film film-forming step S140 (that is, the film-forming step), the following two steps, that is, an HCDS gas supply step S141 and an $O_2$ gas supply step S143 are sequentially performed.

<HCDS Gas Supply Step S141>

In the HCDS gas supply step S141, the HCDS gas is supplied to the wafer 200 in the process chamber 23.

Specifically, the valve 52b is opened to supply the HCDS gas into the gas supply pipe 52. After a flow rate of the HCDS gas is adjusted by the MFC 52a, the HCDS gas whose flow rate is adjusted is supplied into the process chamber 23 through the gas supply pipe 51 and the nozzle 24. The HCDS gas supplied into the process chamber 23 flows upward in the process chamber 23, flows out through an upper end opening of the inner tube 21 to the exhaust flow path 25, flows down the exhaust flow path 25, and is exhausted through the exhaust pipe 61 via the pumping structure 26. Thereby, the HCDS gas is supplied to the wafers 200. When the HCDS gas is supplied to the wafers 200, the valves 53b and 55b may be opened to supply the $N_2$ gas into the process chamber 23 through the gas supply pipes 51, 53 and 55 and the nozzle 24. Alternatively, the $N_2$ gas may not be supplied into the process chamber 23. By exhausting the gas from an inside of the process chamber 23 via the pumping structure 26, it is possible to stabilize an exhaust operation described above.

For example, process conditions of the present step are as follows:
A supply flow rate of the HCDS gas: from 0.01 slm to 2 slm, preferably from 0.1 slm to 1 slm;
A supply flow rate of the $N_2$ gas (for each gas supply pipe): from 0 slm to 10 slm;
A supply time (time duration) of supplying each gas: from 0.1 second to 120 seconds, preferably from 0.1 seconds to 60 seconds;
A process temperature: from 250° C. to 900° C., preferably from 400° C. to 700° C.; and
A process pressure: from 1 Pa to 2,666 Pa, preferably from 67 Pa to 1,333 Pa.

In the present specification, for example, a numerical range such as "1 Pa to 2,666 Pa" refers to a range that a lower limit and an upper limit are included in the numerical range. Therefore, for example, the numerical range "1 Pa to 2,666 Pa" means a range equal to or more than 1 Pa and equal to or less than 2,666 Pa. The same also applies to other numerical ranges described herein.

By supplying the HCDS gas to the wafer 200 according to the process conditions described above, a silicon-containing layer containing chlorine (Cl) (whose thickness is, for example, within a range from less than a single atomic layer to several atomic layers) is formed as a first layer on an outermost surface of the wafer 200. The silicon-containing layer containing chlorine may be formed by chemical adsorption or physical adsorption of the HCDS on the front surface of the wafer 200, by chemical adsorption of a substance (hereinafter, referred to as "$Si_xCl_y$") generated by decomposing a part of the HCDS on the front surface of the wafer 200, or by deposition of silicon generated by thermal decomposition of the HCDS on the front surface of the wafer 200. The silicon-containing layer containing chlorine may be an adsorption layer (physical adsorption layer or chemical adsorption layer) of the HCDS or the $Si_xCl_y$, or may be a deposition layer of silicon containing chlorine. In the present specification, the silicon-containing layer containing chlorine may also be simply referred to as a "silicon-containing layer".

When the HCDS gas is supplied to the wafers 200, the $N_2$ gas is supplied into the transfer chamber 33 to purge an inner atmosphere of the transfer chamber 33. Specifically, the valve 56b is opened to supply the $N_2$ gas into the gas supply pipe 56. After a flow rate of the $N_2$ gas is adjusted by the MFC 56a, the $N_2$ gas whose flow rate is adjusted is supplied into the transfer chamber 33. The $N_2$ gas supplied into the transfer chamber 33 flows upward in the transfer chamber 33, and is discharged to the pumping structure 26 via the plurality of openings 27. The $N_2$ gas discharged to the pumping structure 26 is exhausted through the exhaust pipe 61 together with the HCDS gas discharged to the pumping structure 26 from the process chamber 23. By exhausting the gas from the transfer chamber 33 via the pumping structure 26, it is possible to stabilize the exhaust operation.

The $N_2$ gas is supplied into the transfer chamber 33 under conditions that a gas pressure in the transfer chamber 33 is higher than a gas pressure in the process chamber 23 (that is, the gas pressure in the process chamber 23 is lower than the gas pressure in the transfer chamber 33) and that the flow rate of the gas supplied into the transfer chamber 33 is greater than a total flow rate of the gases supplied into the process chamber 23 (that is, the total flow rate of the gases supplied into the process chamber 23 is less than the flow rate of the gas supplied into the transfer chamber 33).

After the first layer is formed on the front surface of the wafer 200, the valve 52b is closed to stop the supply of the HCDS gas into the process chamber 23. Then, a substance such as a residual gas in the process chamber 23 is removed from the process chamber 23 (purge step). When removing the residual gas, with the valves 53b and 55b open, the $N_2$ gas may be supplied into the process chamber 23 through the gas supply pipe 51 and the nozzle 24. The $N_2$ gas serves as the purge gas. Thereby, it is possible to purge the inner atmosphere of the process chamber 23.

Instead of the HCDS gas, for example, a chlorosilane-based gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane ($SiCl_4$, abbreviated as STC) gas and octachlorotrisilane ($Si_3Cl_8$, abbreviated as OCTS) gas may be used as the source gas.

Instead of the $N_2$ gas, for example, a rare gas such as argon (Ar) gas, helium (He) gas, neon (Ne) gas and xenon (Xe) gas may be used as the inert gas. The same also applies to each step described later.

<$O_2$ Gas Supply Step S143>

In the $O_2$ gas supply step S143, the $O_2$ gas is supplied to the wafer 200 in the process chamber 23, that is, the first layer formed on the wafer 200.

Specifically, the valve 54b is opened to supply the $O_2$ gas into the gas supply pipe 54. After a flow rate of the $O_2$ gas is adjusted by the MFC 54a, the $O_2$ gas whose flow rate is adjusted is supplied into the process chamber 23 through the gas supply pipe 51 and the nozzle 24. The $O_2$ gas supplied into the process chamber 23 flows upward in the process chamber 23, flows out through the upper end opening of the inner tube 21 to the exhaust flow path 25, flows down the exhaust flow path 25, and is exhausted through the exhaust pipe 61 via the pumping structure 26. Thereby, the $O_2$ gas is supplied to the wafers 200. When the $O_2$ gas is supplied to the wafers 200, the valves 53b and 55b are closed in order to prevent the $N_2$ gas from being supplied into the process chamber 23 together with the $O_2$ gas. That is, the $O_2$ gas is supplied into the process chamber 23 without being diluted with the $N_2$ gas, and is exhausted through the exhaust pipe 61. By supplying the $O_2$ gas into the process chamber 23 without being diluted with the $N_2$ gas, it is possible to improve a film-forming rate of the SiO film.

Further, in the $O_2$ gas supply step S143, the $N_2$ gas is supplied into the transfer chamber 33 to purge the inner atmosphere of the transfer chamber 33 according to the same process sequence as that of the HCDS gas supply step S141 described above.

For example, process conditions of the present step are as follows:

A supply flow rate of the $O_2$ gas: from 0.1 slm to 10 slm; and

A process pressure: from 1 Pa to 4,000 Pa, preferably from 1 Pa to 3,000 Pa.

The other process conditions are the same as the process conditions of the HCDS gas supply step S141 described above.

By supplying the $O_2$ gas to the wafer 200 under the above-described process conditions, at least a part of the first layer formed on the wafer 200 is oxidized (modified). By modifying the first layer, a second layer containing silicon (Si) and oxygen (O), that is, an SiO layer is formed on the wafer 200. When the second layer is formed, impurities such as chlorine contained in the first layer may form a gas phase substance containing at least chlorine during a modifying reaction of the first layer by the $O_2$ gas, and the gas phase substance is discharged from the process chamber 23. As a result, the second layer becomes a layer which contains a smaller amount of the impurities such as chlorine than the first layer.

After the second layer is formed, the valve 54b is closed to stop the supply of the $O_2$ gas into the process chamber 23. Then, a substance such as a residual gas in the process chamber 23 is removed from the process chamber 23 according to the same process sequence and process conditions as those of the purge step of the HCDS gas supply step S141 described above.

Instead of the $O_2$ gas, for example, an oxygen-containing gas such as nitrous oxide ($N_2O$) gas, nitrogen monoxide (NO) gas, nitrogen dioxide ($NO_2$) gas, ozone ($O_3$) gas, water vapor ($H_2O$ gas), carbon monoxide (CO) gas and carbon dioxide ($CO_2$) gas may be used as the reactive gas (that is, the oxidizing agent).

<Determination Step (Performing Predetermined Number of Times) S150>

By performing the cycle wherein the HCDS gas supply step S141 and the $O_2$ gas supply step S143 described above are performed non-simultaneously (that is, alternately without overlapping with each other) in this order a predetermined number (n, n is an integer equal to or greater than 1) of times, it is possible to form the SiO film on the front surface of the wafer 200. It is preferable that the cycle is performed a plurality of times. That is, it is preferable that the cycle is repeatedly performed the plurality of times (for example, about 10 times to 80 times, more preferably about 10 times to 15 times) until the SiO film of a desired thickness (for example, 0.1 nm to 2 nm) is obtained by controlling the SiO layer formed in each cycle to be thinner than the SiO film of the desired thickness and by stacking the SiO layer by repeatedly performing the cycle. Every time the cycle described above is completed, it is determined whether or not the cycle has been performed a preset number of times (that is, the predetermined number of times).

<After-Purge Step S160>

After it is confirmed that the cycle described above has been repeatedly performed the predetermined number of times, the $N_2$ gas serving as the purge gas is supplied into the process chamber 23 through each of the gas supply pipes 53 and 55, and is exhausted through the exhaust pipe 61 via the pumping structure 26. As a result, the inner atmosphere of the process chamber 23 is purged, and a substance such as a residual gas and by-products in the process chamber 23 is removed from the process chamber 23.

<Returning to Atmospheric Pressure Step S170>

Thereafter, the inner atmosphere of the process chamber 23 is replaced with the inert gas (substitution by the inert gas), and the inner pressure of the process chamber 23 is returned to the normal pressure (atmospheric pressure).

<Boat Unloading Step S180>

Thereafter, as shown in FIG. 2, the boat 41 is lowered by the elevator/rotator 44 in a process sequence reverse to that of the boat loading step S120 described above, and the boat 41 with the processed wafers 200 charged therein is unloaded out of the process chamber 23 to the transfer chamber 33 of the lower chamber 30 (boat unloading).

<Wafer Discharging Step S190>

Thereafter, the processed wafers 200 are discharged (transferred) from the boat 41 and transferred out of the lower chamber 30 through the substrate loading/unloading port 32 in a process sequence reverse to that of the wafer charging step S110 described above (wafer discharging). In addition, the processed wafers 200 are discharged from a lower portion of the boat 41. That is, the boat unloading step S180 and the wafer discharging step S190 may be performed partially in parallel.

Thereby, the film-forming step of forming the SiO layer on each of the wafers 200 is completed.

(3) Effects According to Present Embodiments

According to the present embodiments described above, it is possible to obtain at least one among the following effects.

(a) According to the present embodiments, the plate 46 is arranged in the boat 41 corresponding to the wafer 200 located immediately above the plate 46, and the thickness of the outer peripheral portion of the plate 46 is different from that of the central portion of the plate 46. That is, the plate 46 is configured such that the heat capacity of the plate 46 is different along the radial direction depending on the distance from the heater 10 to the plate 46 in the process chamber 23. As a result, it is possible to improve the uniformity of the temperature of the wafer 200 on the surface of the wafer 200 in the film-forming process.

(b) According to the present embodiments, the thickness of the outer peripheral portion of the plate 46 is set to be greater than the thickness of the central portion of the plate 46, and the heat capacity of the outer peripheral portion of the plate 46 is set to be greater than the heat capacity of the central portion of the plate 46. As a result, as described above, it is possible to reliably improve the uniformity of the temperature of the wafer 200 on the surface of the wafer 200 when the wafer 200 is being heated or cooled in the film-forming process.

(c) According to the present embodiments, the plate 46 is arranged in the boat 41 such that the front surface of the plate 46 is disposed parallel to the back surface of the wafer 200 located immediately above the plate 46. Thereby, it is possible to uniformize the heat capacity of the space between the back surface of the wafer 200 and the front surface of the plate 46, and it is also possible to reliably improve the uniformity of the temperature of the wafer 200 on the surface of the wafer 200 in the film-forming process.

(d) According to the present embodiments, the plate 46 is arranged in the boat 41 such that the space (or the volume of the space) facing the front surface of the wafer among the wafers 200 located immediately below the plate 46 is greater than the space (or the volume of the space) facing the back surface of the wafer 200 located immediately above the plate 46. As a result, the amount of the gas flowing in the space on the front surface of the wafer 200 is set to be greater than the amount of the gas flowing in the space on the back surface of the wafer 200, and it is also possible to prevent (or suppress) the film-forming rate in the film-forming process from being decreased. In addition, by increasing the amount of the gas flowing in the space on the front surface of the wafer 200, it is possible to prevent (or suppress) the gas from being stagnated on the front surface of the wafer 200. Thereby, it is possible to improve the uniformity of the processing of the wafer 200 on the surface of the wafer 200. In addition, even when the gas that generates a substance easily decomposed by the heat such as the HCDS gas (which is the chlorosilane-based gas) is used, it is possible to prevent (or suppress) the decomposed substance from being stagnated on the front surface of the wafer 200, and it is also possible to improve the uniformity of the processing of the wafer 200 on the surface of the wafer 200.

(e) According to the present embodiments, the plate 46 is arranged in the boat 41 such that the space between the back surface of the wafer 200 located immediately above the plate 46 and the front surface of the plate 46 is provided (that is, the plate 46 does not make contact with the wafer 200). Thereby, the wafer 200 is mainly heated by the heat radiation from the heater 10 and the heat radiation from the plate 46. As a result, it is possible to improve the uniformity of the temperatures of the wafers 200 in the film-forming process.

(f) According to the present embodiments, the outer peripheral portion of the plate 46 protrudes downward in the wafer arrangement direction to form the convex portion, and the front surface of the plate 46 is configured as the flat surface. Thereby, it is possible to prevent (or suppress) the gas flow of the gas from being obstructed on the back surface of the wafer 200 even when the space on the back surface of the wafer 200 located immediately above the plate 46 is decreased. In addition, it is possible to prevent the plate 46 from obstructing the operation of the arm of the transfer robot when the transfer robot loads or unloads the wafer 200 onto or out of the boat 41. Further, it is possible to increase the shortest distance between adjacent plates 46 as compared with a case where the convex portion is provided on the front surface of the outer peripheral portion of the plate 46 and the back surface of the plate 46 is configured as the flat surface, and it is also possible to prevent the arm of the transfer robot from making contact with the plate 46 when the wafer 200 is loaded onto or unloaded out of the boat 41.

(4) Modified Examples

The plate 46 according to the technique of the present disclosure is not limited to the embodiments described above, and can be modified as shown in the following modified examples. The modified examples described below may be combined appropriately.

First Modified Example

Figure 3B:
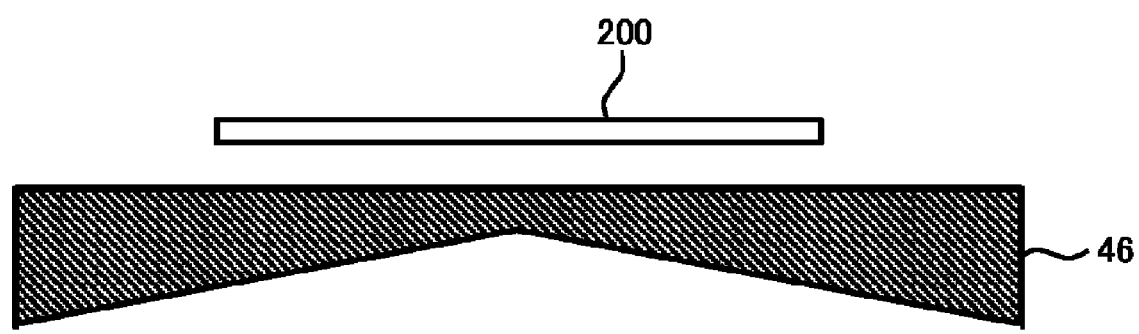
FIGS. 3B and 3C are enlarged views schematically illustrating modified examples of the main configuration of the substrate processing apparatus preferably used in the embodiments of the present disclosure, respectively.
Figure 3C:
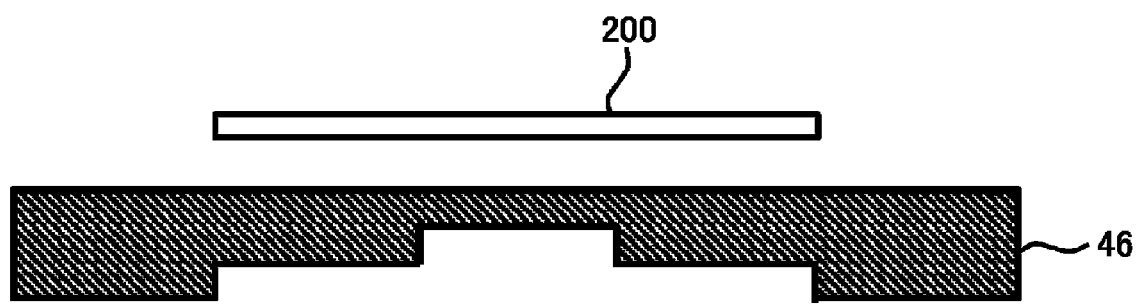

The thickness of the plate 46 may be increased along its radial direction from an inside to an outside. For example, as shown in FIG. 3B, the thickness of the plate 46 may be increased along its radial direction from the inside to the outside such that the back surface of the plate 46 is configured without steps but with a continuous slope and a curved surface. In addition, for example, as shown in FIG. 3C, the thickness of the plate 46 may be increased in a stepwise manner along its radial direction from the inside to the outside. According to the present modified example, the same effects according to the embodiments described above may be obtained similarly.

Second Modified Example

The thickness of each of the plates 46 may be different depending on its arrangement position on the boat 41. A central region (also referred to as a "center zone") of the wafer arrangement region in the wafer arrangement direction is to be heated more easily than an upper region (also referred to as a "top zone") and a lower region (also referred to as a "bottom zone") of the wafer arrangement region in the wafer arrangement direction. Therefore, for example, the thickness of the central portion (thinnest portion) of the plate among the plates 46 arranged in the center zone (that is, the plate among the plates 46 arranged in a central portion of the boat 41 in the vertical direction) may be set to be thinner than the thickness of the central portion of the plate among the plates 46 arranged in the top zone or the bottom zone (that is, the plate among the plates 46 arranged in an upper portion or the lower portion of the boat 41 in the vertical direction). According to the present modified example, it is possible to reliably improve the uniformity of the temperatures of the wafers 200 in the film-forming process.

In addition, for example, the thickness of the central portion (thinnest portion) of the plate among the plates 46 arranged in the center zone may be set to be thinner than the thickness of the central portion of the plate among the plates 46 arranged in the top zone and the thickness of the central portion of the plate among the plates 46 arranged in the bottom zone. Thereby, it is possible to more reliably improve the uniformity of the temperatures of the wafers 200 in the film-forming process.

Further, for example, in addition to setting the thickness of the outer peripheral portion of the plate 46 greater than the thickness of the central portion of the plate 46, the thickness of the outer peripheral portion (thickest portion) of the plate among the plates 46 arranged in the center zone may be set to be thinner than the thickness of the outer peripheral portion of the plate among the plates 46 arranged in the top zone or the bottom zone, preferably, thinner than the thickness of the outer peripheral portion of the plate among the plates 46 arranged both in the top zone and in the bottom zone. Thereby, it is possible to more reliably improve the uniformity of the temperatures of the wafers 200 in the film-forming process.

Third Modified Example

The material constituting each of the plates 46 may be different depending on the arrangement position of each of the plates 46 on the boat 41. That is, the plate among the plates 46 arranged in the center zone (that is, the plate among the plates 46 arranged in the central portion of the boat 41 in the vertical direction) may be made of a material different from that of the plate among the plates 46 arranged in the top zone or the bottom zone (that is, the plate among the plates 46 arranged in the upper portion or the lower portion of the boat 41 in the vertical direction). For example, the plate among the plates 46 arranged in the top zone or the bottom zone may be made of a material that is more likely to absorb the heat from the heater 10 than that of the plate among the plates 46 arranged in the center zone. According to the present modified example, it is possible to reliably improve the uniformity of the temperatures of the wafers 200 in the film-forming process.

Further, for example, in addition to setting the material constituting each of the plates 46 different depending on the arrangement position of each of the plates 46 on the boat 41, the material constituting the outer peripheral portion of each of the plates 46 may be different from the material constituting the central portion of each of the plates 46. Thereby, it is possible to similarly obtain the same effects according to the embodiments described above while more reliably improving the uniformity of the temperatures of the wafers 200 in the film-forming process.

Fourth Modified Example

The outer peripheral portion of the plate 46 is not limited to a case where it is integrally provided with the central portion of the plate 46 as a single body, and the outer peripheral portion of the plate 46 may be provided as a separate body from the central portion of the plate 46. Thereby, it is possible to easily change the heat capacity in the radial direction of the plate 46 according to the contents of the film-forming process, and it is also possible to reliably improve the uniformity of the temperature of the wafer 200 on the surface of the wafer 200 in the film-forming process.

Fifth Modified Example

When the central portion of the wafer 200 is more likely to be heated (or cooled) than the outer peripheral portion of the wafer 200, the thickness of the central portion of the plate 46 may be set to be greater than the thickness of the outer peripheral portion of the plate 46 such that the heat capacity of the central portion of the plate 46 is greater than the heat capacity of the outer peripheral portion of the plate 46. Thereby, when the wafer 200 is being heated in the film-forming process, it is possible to increase the heat radiation from the plate 46 in the outer peripheral portion of the wafer 200, and it is also possible to decrease the heat radiation from the plate 46 in the central portion of the wafer 200. In addition, when the wafer 200 is being cooled in the film-forming process, it is possible to decrease the heat radiation from the plate 46 in the outer peripheral portion of the wafer 200, and it is also possible to increase the heat radiation from the plate 46 in the central portion of the wafer 200. Thereby, according to the present modified example, the same effects according to the embodiments described above may be obtained similarly.

Other Embodiments According to Technique of Present Disclosure

While the technique of the present disclosure is described in detail by way of the embodiments described above, the above-described technique is not limited thereto. The above-described technique may be modified in various ways without departing from the scope thereof.

For example, the above-described embodiments are described by way of an example in which the reaction tube 20 is constituted by the inner tube 21 and the outer tube 22. However, the above-described technique is not limited thereto. For example, the above-described technique may also be applied when the reaction tube 20 is constituted by the outer tube 22 alone without including the inner tube 21.

For example, the above-described embodiments are described by way of an example in which the lower chamber 30 is provided below the reaction tube 20. However, the above-described technique is not limited thereto. For example, the above-described technique may also be applied when a horizontal type reaction tube is provided instead of the reaction tube 20 and a chamber is arranged next to the horizontal type reaction tube instead of the lower chamber 30. In addition, even when the vertical type apparatus is used, a chamber may be arranged above the reaction tube 20 instead of the lower chamber 30. That is, a chamber serving as the transfer chamber of the substrate is not limited to the lower chamber 30 described above as long as it is connected to the reaction tube.

For example, the above-described embodiments are described by way of an example in which the SiO film serving as the film is formed by using the HCDS gas as the source gas and the $O_2$ gas as the reactant. However, the above-described technique is not limited thereto.

For example, as the reactant, instead of the oxygen-containing gas such as the $O_2$ gas, a nitrogen (N)-containing gas such as ammonia ($NH_3$) gas, a gas containing nitrogen and carbon (C) such as triethylamine (($C_2H_5)_3N$, abbreviated as TEA) gas, a carbon-containing gas such as propylene ($C_3H_6$) gas, or a boron (B)-containing gas such as trichloroborane ($BCl_3$) gas may be used. Then, by using gas supply sequences described below, a film such as a silicon nitride film (SiN film), a silicon oxynitride film (SiON film), a silicon carbonitride film (SiCN film), a silicon oxycarbide film (SiOC film), a silicon oxycarbonitride film (SiOCN film), a silicon boronitride film (SiBN film) and a silicon boron carbonitride film (SiBCN film) may be formed on the front surface of the substrate. Even in such a case, the same effects according to the embodiments described above may be obtained similarly. The process sequence and the process conditions of supplying the reactive gas to form the various films described above may be substantially the same as those of supplying the reactive gas according to the embodiments described above. In such a case, the same effects according to the embodiments described above may also be obtained similarly.

$$(HCDS \rightarrow NH_3) \times n \Rightarrow SiN$$

$$(HCDS \rightarrow O_2 \rightarrow NH_3) \times n \Rightarrow SiON$$

$$(HCDS \rightarrow TEA) \times n \Rightarrow SiCN$$

$$(HCDS \rightarrow TEA \rightarrow O_2) \times n \Rightarrow SiOC(N)$$

$$(HCDS \rightarrow C_3H_6 \rightarrow NH_3 \rightarrow O_2) \times n \Rightarrow SiOCN$$

$$(HCDS \rightarrow C_3H_6 \rightarrow O_2 \rightarrow NH_3) \times n \Rightarrow SiOCN$$

$$(HCDS \rightarrow BCl_3 \rightarrow NH_3) \times n \Rightarrow SiBN$$

$$(HCDS \rightarrow C_3H_6 \rightarrow BCl_3 \rightarrow NH_3) \times n \Rightarrow SiBCN$$

$$(DCS \rightarrow O_2) \times n \Rightarrow SiO$$

$$(DCS \rightarrow O_2 \rightarrow NH_3) \times n \Rightarrow SiON$$

For example, the source and the reactant may be simultaneously supplied to the substrate to form the various films described above on the substrate. For example, the source may be supplied alone to the substrate to form a silicon film (Si film) on the substrate. In such cases, the same effects according to the embodiments described above may also be obtained similarly. The process sequence and the process conditions of supplying the source or the reactant to form the various films described above may be substantially the same as those of supplying the source or the reactant according to the embodiments described above. In such a case, the same effects according to the embodiments described above may also be obtained similarly.

For example, the above-described technique may also be applied to form a metal-based film containing an element such as titanium (Ti), zirconium (Zr), hafnium (Hf), tantalum (Ta), niobium (Nb), aluminum (Al), molybdenum (Mo) and tungsten (W). In such a case, the same effects according to the embodiments described above may also be obtained similarly. That is, the above-described technique may be applied to form a film containing a predetermined element such as a metalloid element (semiconductor element) and a metal element.

For example, the above-described embodiments are described by way of an example in which the substrate processing is performed to form the film on the substrate. However, the above-described technique is not limited thereto. That is, the above-described technique may be applied not only to the film-forming process of forming the film exemplified in the embodiments but also to a film-forming process of forming another film. In addition, for example, the specific contents of the substrate processing may not be limited to those exemplified in the embodiments. For example, in addition to the film-forming process or instead of the film-forming process, the above-described technique may be applied to another substrate processing such as a heat treatment process (annealing process), a plasma process, a diffusion process, an oxidation process, a nitridation process, a lithography process and a reflow process for the carrier activation or the planarization after the ion implantation.

For example, recipes used in the processes described above may be preferably prepared individually according to the process contents and stored in the memory 73 via an electric communication line or the external memory 81. When starting each process, preferably, the CPU 71 is configured to select an appropriate recipe among the recipes stored in the memory 73 according to the process contents. Thus, various films of different composition ratios, qualities and thicknesses may be formed in a reproducible manner by using a single substrate processing apparatus. In addition, since the burden on an operator of the substrate processing apparatus may be reduced, various processes may be performed quickly while avoiding a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. The existing recipe already stored in the substrate processing apparatus may be directly changed to a new recipe by operating the input/output device 82 of the substrate processing apparatus.

For example, the above-described embodiments are described by way of an example in which a batch type substrate processing apparatus configured to simultaneously process a plurality of substrates is used to form the film. However, the above-described technique is not limited thereto. For example, the above-described technique may be preferably applied when a single wafer type substrate processing apparatus configured to process one or several substrates at a time is used to form the film. For example, the above-described embodiments are described by way of an example in which a substrate processing apparatus including a hot wall type process furnace is used to form the film. However, the above-described technique is not limited thereto. For example, the above-described technique may be preferably applied when a substrate processing apparatus including a cold wall type process furnace is used to form the film.

For example, the above-described embodiments are described by way of an example in which the substrate processing is performed by heating with a resistance heating type heater. However, the above-described technique is not limited thereto. For example, the above-described technique may also be applied when the heating in the substrate processing is performed by the irradiation with ultraviolet lights. When the heating is performed by the irradiation with the ultraviolet lights, instead of the heater 10, a lamp such as a deuterium lamp, a helium lamp, a carbon arc lamp, a BRV light source, an excimer lamp and a mercury lamp may be used as the heating structure. Further, the heater and the heating structure such as the lamp may be used in combination. In such a case, it is preferable that the central portion of the plate (that is, the plate-shaped structure) is made of a material capable of absorbing the wavelength emitted from the lamp more easily than a material constituting the outer peripheral portion of the plate.

The process sequence and the process conditions of each process using the substrate processing apparatuses described above may be substantially the same as those of the above-described embodiments. Even in such a case, the same effects according to the embodiments described above may also be obtained similarly.

The embodiments described above and the modified examples described above may be appropriately combined. In addition, the process sequence and the process conditions of each combination thereof may be substantially the same as those of the embodiments described above.

According to some embodiments of the present disclosure, it is possible to provide the technique capable of improving the uniformity of the temperature distribution on the surface of the substrate in the substrate processing.

What is claimed is:

1. A substrate processing apparatus comprising:
   a process chamber in which one or more substrates are processed; and
   a substrate support configured to support the one or more substrates in the process chamber,
   wherein the substrate support comprises one or more plate-shaped structures arranged in the substrate support in a manner corresponding to the one or more substrates,
   wherein a thickness of a central portion of a plate-shaped structure among the one or more plate-shaped structures is different from a thickness of an outer peripheral portion of the plate-shaped structure located outer of the central portion, and
   wherein the outer peripheral portion of the plate-shaped structure is provided as a separate body from the central portion of the plate-shaped structure.

2. The substrate processing apparatus of claim 1, wherein the thickness of the outer peripheral portion of the plate-shaped structure is greater than the thickness of the central portion of the plate-shaped structure.

3. The substrate processing apparatus of claim 1, wherein the central portion of the plate-shaped structure faces a substrate among the one or more substrates.

4. The substrate processing apparatus of claim 1, wherein the plate-shaped structure is arranged in the substrate support such that a front surface of the plate-shaped structure faces a back surface of an immediately upper substrate among the one or more substrates located immediately above the plate-shaped structure and is disposed parallel to the back surface of the immediately upper substrate.

5. The substrate processing apparatus of claim 1, wherein the plate-shaped structure is arranged in the substrate support such that a space between the plate-shaped structure and a front surface of an immediately lower substrate among the one or more substrates located immediately below the plate-shaped structure is greater than a space between the plate-shaped structure and a back surface of an immediately upper substrate among the one or more substrates located immediately above the plate-shaped structure.

6. The substrate processing apparatus of claim 1, wherein a thickness of the plate-shaped structure is increased along a radial direction from an inside to an outside of the plate-shaped structure.

7. The substrate processing apparatus of claim 1, wherein the thickness of the outer peripheral portion of the plate-shaped structure is set to be greater than the thickness of the central portion of the plate-shaped structure over an entire circumference along a circumferential direction of the plate-shaped structure.

8. The substrate processing apparatus of claim 1, wherein a back surface of the outer peripheral portion of the plate-shaped structure protrudes further than a back surface of the central portion of the plate-shaped structure.

9. The substrate processing apparatus of claim 1, wherein the plate-shaped structure is made of a highly thermal conductive material.

10. The substrate processing apparatus of claim 1, further comprising
    a heater configured to heat the process chamber,
    wherein the central portion of the plate-shaped structure is made of a material capable of absorbing heat from the heater more easily than a material constituting the outer peripheral portion of the plate-shaped structure.

11. The substrate processing apparatus of claim 1, wherein a front surface of the plate-shaped structure is subject to a surface treatment such that a surface area of the front surface of the plate-shaped structure is substantially equal to a surface area of a back surface of an immediately upper substrate among the one or more substrates located immediately above the plate-shaped structure.

12. The substrate processing apparatus of claim 1, wherein the substrate support is configured to support the one or more substrates in a vertical direction with a predetermined gap therebetween, and
    wherein a thickness of a central portion of a plate-shaped structure among the one or more plate-shaped structures arranged in a central portion of the substrate support is thinner than a thickness of a central portion of another plate-shaped structure among the one or more plate-shaped structures arranged in an upper portion or a lower portion of the substrate support.

13. The substrate processing apparatus of claim 1, wherein the substrate support is configured to support the one or more substrates in a vertical direction with a predetermined gap therebetween, and
    wherein a plate-shaped structure among the one or more plate-shaped structures arranged in a central portion of the substrate support is made of a material different from that of another plate-shaped structure among the one or more plate-shaped structures arranged in an upper portion or a lower portion of the substrate support.

14. A method of manufacturing a semiconductor device, comprising:
    performing a predetermined process on a substrate by using the substrate processing apparatus according to claim 1.

15. A substrate support configured to support a substrate in a process chamber of a substrate processing apparatus, the substrate support comprising
    a plate-shaped structure,
    wherein a thickness of a central portion of the plate-shaped structure is different from a thickness of an outer peripheral portion of the plate-shaped structure located outer of the central portion,
    wherein the plate-shaped structure is arranged in the substrate support in a manner corresponding to the substrate while the substrate support supports the substrate, and
    wherein the outer peripheral portion of the plate-shaped structure is provided as a separate body from the central portion of the plate-shaped structure.

16. A substrate processing apparatus comprising:
    a process chamber in which one or more substrates are processed;

a substrate support configured to support the one or more substrates in the process chamber; and a gas nozzle, through which a process gas is supplied to the one or more substrates in the process chamber, provided with a plurality of gas supply holes, wherein the substrate support comprises one or more plate-shaped structures arranged in the substrate support in a manner corresponding to the one or more substrates, wherein a thickness of a central portion of a plate-shaped structure among the one or more plate-shaped structures is different from a thickness of an outer peripheral portion of the plate-shaped structure located outer of the central portion, wherein the substrate support is configured to support the one or more substrates in a vertical direction with a predetermined gap therebetween, and wherein the plate-shaped structure is arranged such that a vertical position of a gas supply hole among the plurality of gas supply holes provided corresponding to the plate-shaped structure is located between a back surface of the outer peripheral portion of the plate-shaped structure and a front surface of an immediately lower substrate among the one or more substrates located immediately below the plate-shaped structure.

17. A method of manufacturing a semiconductor device, comprising:

performing a predetermined process on a substrate by using the substrate processing apparatus of claim 16.

* * * * *